(12) United States Patent
Wachs et al.

(10) Patent No.: US 9,958,501 B1
(45) Date of Patent: May 1, 2018

(54) SYSTEM FOR ELECTRICAL MEASUREMENTS OF OBJECTS IN A VACUUMED ENVIRONMENT

(71) Applicant: APPLIED MATERIALS ISRAEL LTD., Rehovot (IL)

(72) Inventors: Amir Wachs, Caesarea (IL); Alon Litman, Ness Ziona (IL); Efim Vinnitsky, Ashkelon (IL)

(73) Assignee: APPLIEED MATERIALS ISRAEL LTD., Rehovot (IL)

( * ) Notice: Subject to any disclaimer, the term of this patent is extended or adjusted under 35 U.S.C. 154(b) by 81 days.

(21) Appl. No.: 15/060,245

(22) Filed: Mar. 3, 2016

Related U.S. Application Data

(60) Provisional application No. 62/128,381, filed on Mar. 4, 2015.

(51) Int. Cl.
*H01J 37/26* (2006.01)
*G01R 31/305* (2006.01)
*G01R 1/07* (2006.01)
*G01R 1/18* (2006.01)

(52) U.S. Cl.
CPC ............. *G01R 31/305* (2013.01); *G01R 1/07* (2013.01); *G01R 1/18* (2013.01)

(58) Field of Classification Search
CPC ........ G01Q 60/00; G01Q 60/02; G01Q 60/04; G01R 31/305; G01R 1/07; G01R 1/18
USPC ............. 250/306, 307, 310, 311; 850/22, 23
See application file for complete search history.

(56) References Cited

U.S. PATENT DOCUMENTS

| | | | |
|---|---|---|---|
| 7,526,747 B2 | 4/2009 | Nishiyama et al. | |
| 8,895,923 B2 | 11/2014 | Sanders et al. | |
| 9,057,740 B1 | 6/2015 | Sanders et al. | |
| 2002/0000819 A1* | 1/2002 | Hollman ............ | G01R 31/2851 324/750.03 |
| 2014/0380531 A1 | 12/2014 | Ukraintsev et al. | |
| 2015/0301078 A1 | 10/2015 | Ukraintsev et al. | |
| 2015/0377921 A1* | 12/2015 | Ukraintsev ............ | G01Q 30/02 324/750.19 |
| 2015/0377958 A1 | 12/2015 | Ukraintsev et al. | |

* cited by examiner

*Primary Examiner* — Nicole Ippolito
(74) *Attorney, Agent, or Firm* — Kilpatrick Townsend & Stockton LLP

(57) ABSTRACT

A system for electrically testing an object, the system may include a scanning electron microscope that comprises a column; and nano-probe modules that are mechanically connected to the column; wherein the column is configured to illuminate areas of the object, with a beam of charged particles; wherein nano-probes of the nano-probe modules are configured to electrically contact elements of the object, during electrical tests of the object, wherein the elements of the object are located within the areas of the object.

16 Claims, 14 Drawing Sheets

SYSTEM FOR ELECTRICAL MEASUREMENTS OF OBJECTS IN A VACUUMED ENVIRONMENT

CROSS-REFERENCES TO RELATED APPLICATIONS

This application claims the benefit of U.S. Provisional Application No. 62/128,381, filed on Mar. 4, 2015. The disclosure of which is hereby incorporated by reference in its entirety for all purposes.

BACKGROUND OF THE INVENTION

There is a growing need to provide systems and method for electrically testing nanometric elements of electrical circuits.

SUMMARY OF THE INVENTION

According to an embodiment of the invention there may be provided a system for electrically testing an object, the system may include a scanning electron microscope that may include a column; and nano-probe modules that may be mechanically connected to the column; wherein the column may be configured to illuminate areas of the object, with a beam of charged particles; wherein nano-probes of the nano-probe modules may be configured to electrically contact elements of the object, during electrical tests of the object, wherein the elements of the object may be located within the areas of the object.

The nano-probes of the group of nano-probes and the scanning electron microscope column may be concentric.

The nano-probes of the nano-probe modules may be located within a field of view of the column when positioned in an object-contacting positions.

The nano-probe modules comprise the nano-probes and nano-probe motors that may be configured to move the nano-probes in relation to the object and the column; wherein the system may include a shield that may be configured to reduce contamination as a result of an operation of the nano-probe motors.

The shield may be positioned between the nano-probe motors and the object.

The shield may be an electro-static shield that may be configured to attract at least a part of a contaminants generated by the nano-probe motors.

The system may include a nano-probes calibration target; wherein the system may be configured to utilize the nano-probes calibration target for determining reference nano-probes position parameters that once used cause the nano-probes to be positioned at desired positions.

The system may be configured to use the reference nano-probes position parameters when electrically testing at least one element of the object.

The system may be configured to use the reference nano-probes position parameters to concurrently contact multiple test points of an element of the object.

The system may be configured to use the reference nano-probes position parameters to position a plurality of nano-probes at a same height.

The nano-probe modules may be mechanically connected to the column in a detachable manner; wherein the system may include a nano-probe module replacement module that may be configured to detach the nano-probe modules from the column and replace the nano-probe modules by a new set of nano-probe modules.

The nano-probe module replacement module may be configured to detach the nano-probe modules from the column and replace the nano-probe modules by the new set of nano-probe modules without opening a vacuum chamber in which at least a part of the column may be positioned.

The system may include an internal transfer unit that may be configured to receive, outside the vacuum chamber, the new set of nano-probe module and inset the new set of nano-probe modules into the vacuum chamber.

The scanning electron microscope may be configured to navigate the column towards the areas that may include the elements using computer aided design information of the object.

The scanning electron microscope may be configured to navigate the column towards the areas that comprise the elements using coordinates of the elements.

According to an embodiment of the invention there may be provided a system for electrically testing an object, the system may include: a scanning electron microscope that may include a column; and nano-probe modules that comprise nano-probes and nano-probe motors that may be configured to move the nano-probes in relation to an object and the column; and a shield that may be configured to reduce contamination as a result of an operation of the nano-probe motors; wherein the column may be configured to illuminate areas of the object, with a beam of charged particles; wherein nano-probes of the nano-probe modules may be configured to electrically contact elements of the object, during electrical tests of the object, wherein the elements of the object may be located within the areas of the object.

The shield may be positioned between the nano-probe motors and the object.

The shield may be an electro-static shield that may be configured to attract at least a part of a contaminants generated by the nano-probe motors.

According to an embodiment of the invention there may be provided a system for electrically testing an object, the system may include: a scanning electron microscope that may include a column; nano-probe modules; and a nano-probes calibration target; wherein the column may be configured to illuminate areas of the object, with a beam of charged particles; wherein nano-probes of the nano-probe modules may be configured to electrically contact elements of the object, during electrical tests of the object, wherein the elements of the object may be located within the areas of the object; wherein the system may be configured to utilize the nano-probes calibration target for determining reference nano-probes position parameters that one used cause the nano-probes to be positioned at desired positions.

The system that may be configured to use the reference nano-probes position parameters when electrically testing at least one element of the object.

The system may be configured to use the reference nano-probes position parameters to concurrently contact multiple test points of an element of the object.

The system may be configured to use the reference nano-probes position parameters to position a plurality of nano-probes at a same height.

According to an embodiment of the invention there may be provided a system for electrically testing an object, the system may include: a scanning electron microscope that may include a column; nano-probe modules; and a nano-probe module replacement module; wherein the column may be configured to illuminate areas of the object, with a beam of charged particles; wherein nano-probes of the nano-probe modules may be configured to electrically contact elements of the object, during electrical tests of the object, wherein the elements of the object may be located within the areas of the object; wherein the nano-probe module replacement module may be configured to detach the nano-probe modules from the system and replace the nano-probe modules by a new set of nano-probe modules.

The nano-probe module replacement module may be configured to detach the nano-probe modules and replace the nano-probe modules by the new set of nano-probe modules without opening a vacuum chamber in which at least a part of the column may be positioned.

The system may include an internal transfer unit that may be configured to receive, outside the vacuum chamber, the new set of nano-probe module and inset the new set of nano-probe modules into the vacuum chamber.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof may best be understood by reference to the following detailed description when read with the accompanying drawings in which:

Figure 1:
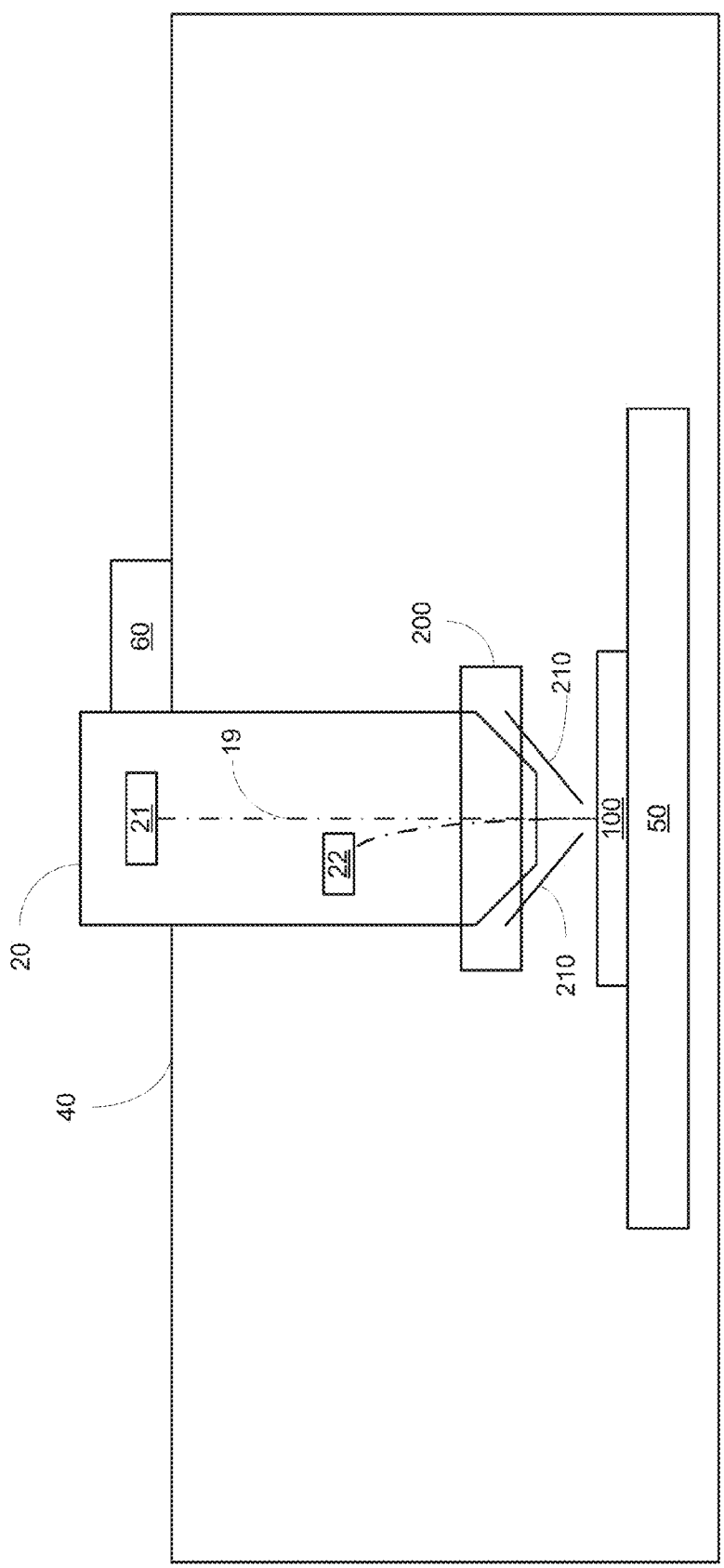
FIG. 1 illustrates a system according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may, for the most part, be implemented using electronic components and modules known to those skilled in the art, details will not be explained in any greater extent than that considered necessary as illustrated above, for the understanding and appreciation of the underlying concepts of the present invention and in order not to obfuscate or distract from the teachings of the present invention.

The assignment of the same reference numbers to various components may indicate that these components are similar to each other.

The term "and/or" means additionally or alternatively. A and/or B includes only A, only B or A and B.

FIG. 1 illustrates a system 11 according to an embodiment of the invention.

System 11 includes a scanning electron microscope (SEM) that is illustrated as including vacuum chamber 40, column 20, mechanical stage 50, a controller 60, and a vacuum pressure system (not shown) that controls the pressure within chamber 40. The column 20, which can be located partly within vacuum chamber 20 and partly outside the vacuum chamber, can include a column cover that is a massive, stable and fixed element at the upper side of chamber 40. Column 20 is illustrated in FIG. 1 as including an electron beam source 21 and an in-lens detector 22, but the column can also include other optical components including one or more lenses. It is noted that system 11 may include a detector that is located outside column 20.

The mechanical stage 50 is configured to support object 100 and to move object 100 in relation to column 20. In some instances object 100 can be a semiconductor substrate but embodiments of the disclosure can be used to test other types of objects as well.

The mechanical stage 50 may include any combination of mechanical stages that are able to perform a desired two-dimensional and/or three dimensional movement of object 100.

Controller 60 may control the operation of system 11.

The scanning electron microscope included in system 11 may be any known scanning electron microscope.

System 11 also includes nano-probe modules 200 that are mechanically connected to the column 20 and include one or more nano-probes. In some embodiments, and as illustrated below, nano-probe modules 200 can include nano-probe motors (not shown in FIG. 1) and nano-probes 210. The column 20 may be configured to illuminate areas of the object 100, with a beam 19 of charged particles, during imaging and during navigation to the locations at which electrical testing is performed.

Nano-probes 210 of the nano-probe modules 200 are configured to electrically contact elements of the object 100, during electrical tests of the object. The elements of the object are located within the areas of the object. The nano-probes 210 may be elevated and electrically disconnected from the object 100 between one electrical test to another.

Elements of object 100 may be electrical components, electrical circuits, portions of electrical components, portions of electrical circuits and the like. An example of an element may be a port of a transistor. An area of an object may correspond to a field of view of the column 20 but this is not necessarily so.

The column 20 is very stable due to various features of system, including but not limited to the substantial weight of the column cover in column 20 and various stabilizing element used in state of the art scanning electron microscopes. Accordingly—mechanically connecting the nano-probe modules to the column 20 allows the nano-probe modules 200 to remain stable and thus contribute to the throughput (no need in excessive and time consuming stabilization periods) and to the accuracy of the positioning of the nano-probes 210 (of nano-probe modules 200) during electrical tests.

Additionally or alternatively, connecting the nano-probe modules 200 to the column 20 eliminates or at least dramatically reduces alignment processes between the column 20 and the nano-probes 210.

Figure 2:
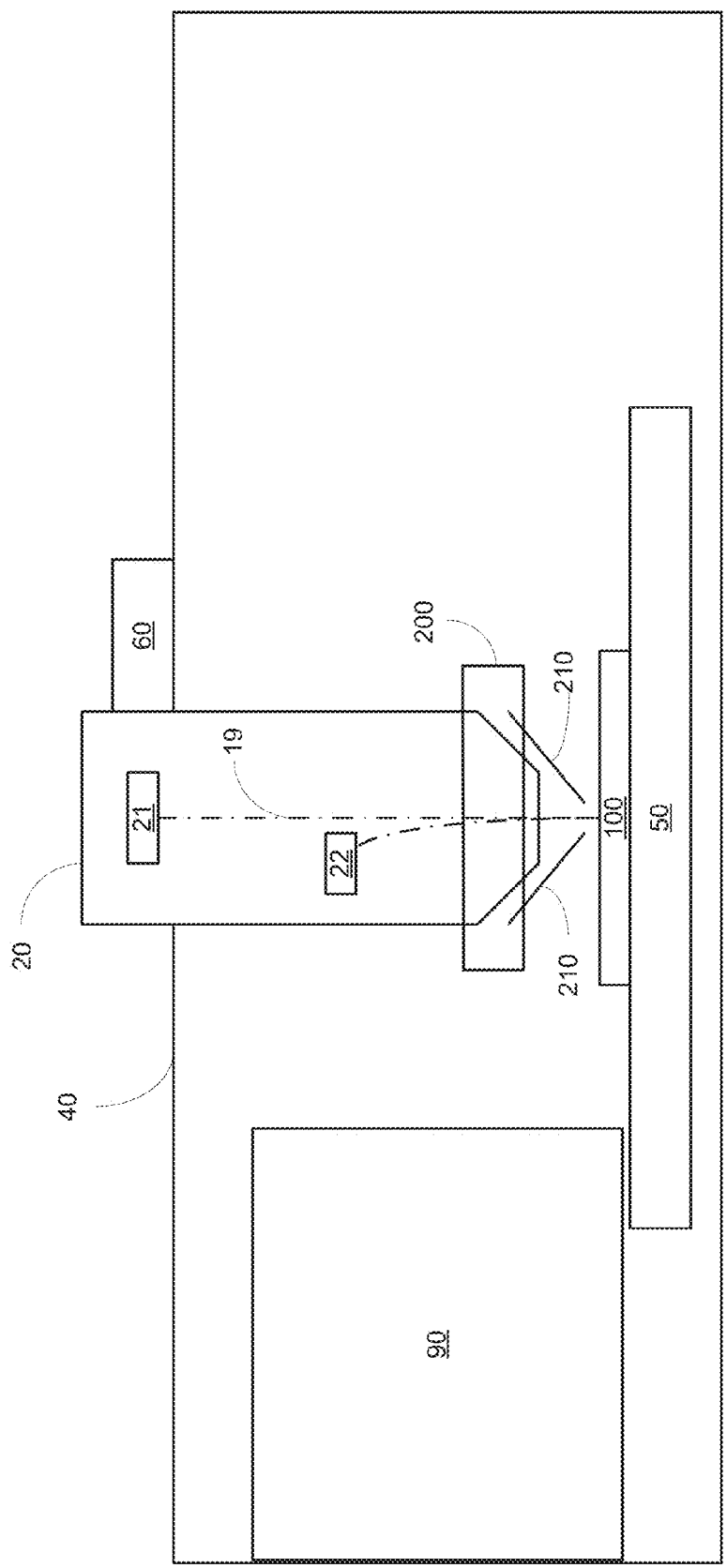
FIG. 2 illustrates a system according to an embodiment of the invention.
Figure 3:
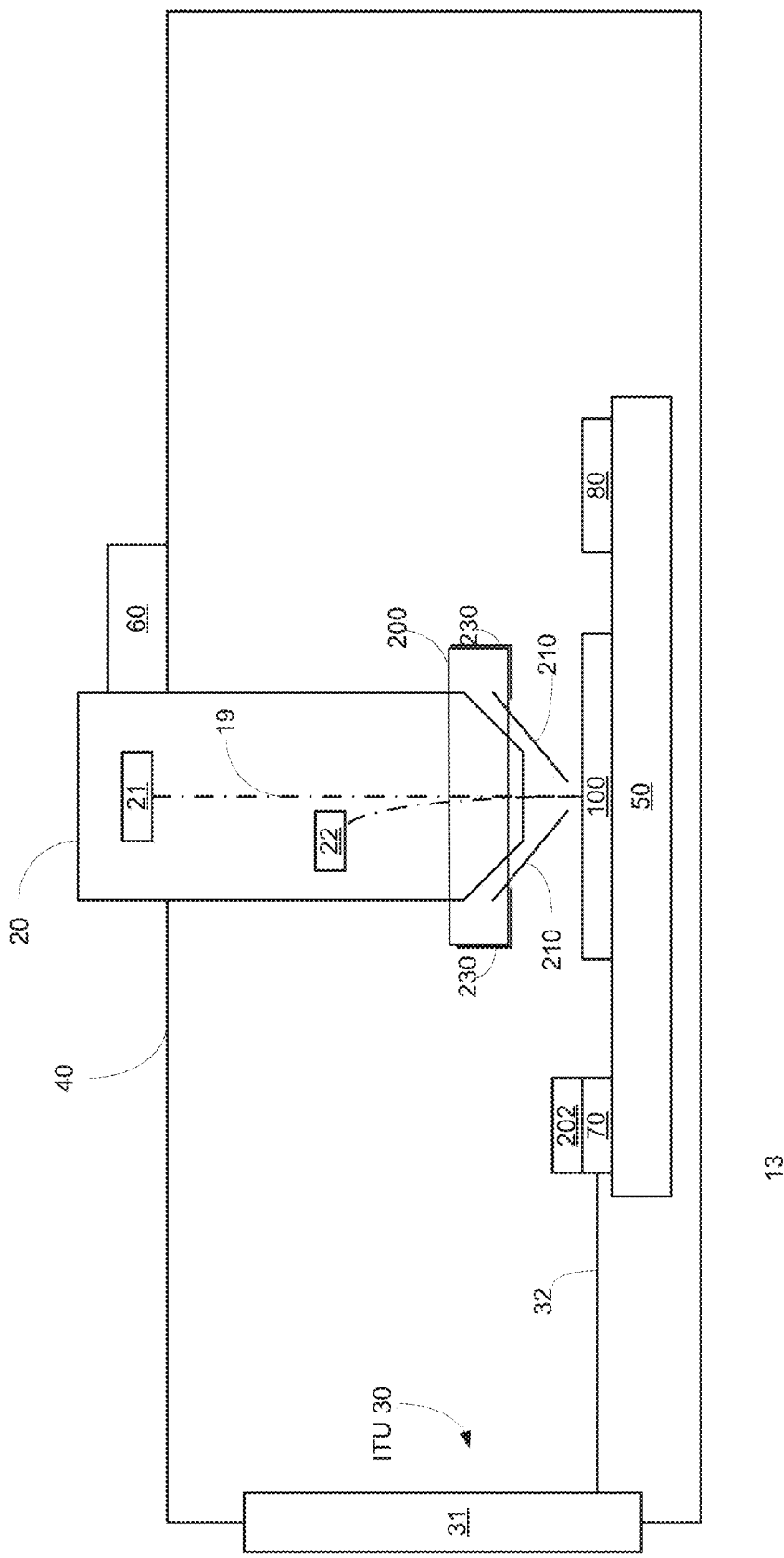
FIG. 3 illustrates a system according to an embodiment of the invention.

FIGS. 2-3 illustrate systems 12 and 13 according to various embodiments of the invention.

System 12 of FIG. 2 includes a scanning electron microscope that is illustrated as including vacuum chamber 40, column 20, mechanical stage 50 and a controller 60.

The column 20 is illustrated as including an electron beam source 21 and an in-lens detector 22. The mechanical stage 50 is configured to support object 100 and to move object 100 in relation to column 20. Controller 60 may control the operation of system 12. The scanning electron microscope included in system 12 may be any known scanning electron microscope.

System 12 also includes nano-probe modules 200 that are mechanically attached to column 20 (e.g., to the column cover) in a detachable manner (e.g., as described with respect to FIGS. 7-10) and nano-probe module replacement module 90.

The column 20 is configured to illuminate areas of the object, with a beam 19 of charged particles. Nano-probes 210 of the nano-probe modules 200 are configured to electrically contact elements of the object, during electrical tests of the object, wherein the elements of the object are located within the areas of the object. The nano-probe module replacement module 90 is configured to detach the nano-probe modules 200 from the system 12 and replace the nano-probe modules 200 with a new set of nano-probe modules.

The nano-probe module replacement module 90 may be configured to detach the nano-probe modules 200 and replace the nano-probe modules 200 with the new set of nano-probe modules without opening vacuum chamber 40.

Exchanging the nano-probe modules without opening the vacuum chamber 40 increases the throughput (as there is no need to recreate desired vacuum conditions following a replacement of the nano-probe modules) and also reduced contamination.

FIG. 3 illustrates the nano-probe replacement module as including a nano probe modules holder 70, and an internal transfer unit (ITU) 30 that includes an arm 32 and a robot controller 31.

During a replacement of nano-probe modules new nano probe modules may be fetched from a nano probe modules holder 70 while "old" nano-probe modules may be placed on the nano probe modules holder 70. The nano probe modules holder may be inserted into vacuum chamber 40 and extracted from vacuum chamber 40 without cancelling the vacuum within the vacuum chamber. It is noted that all nano-probe modules can be replaced at once or only some of the nano-probe modules can be replaced at a time.

The arm 32 may move between a first position (not shown) outside vacuum chamber 40 in which it may load or reload nano probe modules holder 70 and between a second position within the vacuum chamber 40 in which it may unload or load nano probe modules holder 70.

System 13 of FIG. 3 also has a nano-probes calibration target 80.

The system 13 is configured to utilize the nano-probes calibration target 80 for determining reference nano-probes position parameters that one used may cause the nano-probes to be positioned at desired positions.

For example—the nano-probes calibration target 80 may be a plate that has a horizontal upper surface. The different nano-probes may be lowered until each of them touches the horizontal upper plate.

The position parameters that position the nano-probes to contact the horizontal upper surface may be stored and used (as reference position parameters) when the nano-probes should be concurrently lowered to contact multiple elements of interest that are positioned at the same height. If a certain electrical test requires that different nano-probes are positioned at different heights then the reference position parameters may be adjusted accordingly.

This calibration process speeds up the testing process as it allows to concurrently position multiple nano-probes at a desired position before each electrical test.

FIG. 3 also illustrates the system 13 as including a shield 230 that is configured to reduce contamination as a result of an operation of the nano-probe motors (not shown in FIG. 3) that are configured to move the nano-probes in relation to the object and the column.

The shield 230 reduced contaminations resulting from the operation of the nano-probe motors (shown in FIG. 4 as element 220) and thus increases the cleanliness within the vacuum chamber 40.

The shield 230 of FIG. 3 is positioned between the nano-probe motors of nano-probe modules 200 and the object 100.

The shield 230 may be an electro-static shield that is configured to attract at least a part of a contaminants generated by the nano-probe motors.

Figure 4:
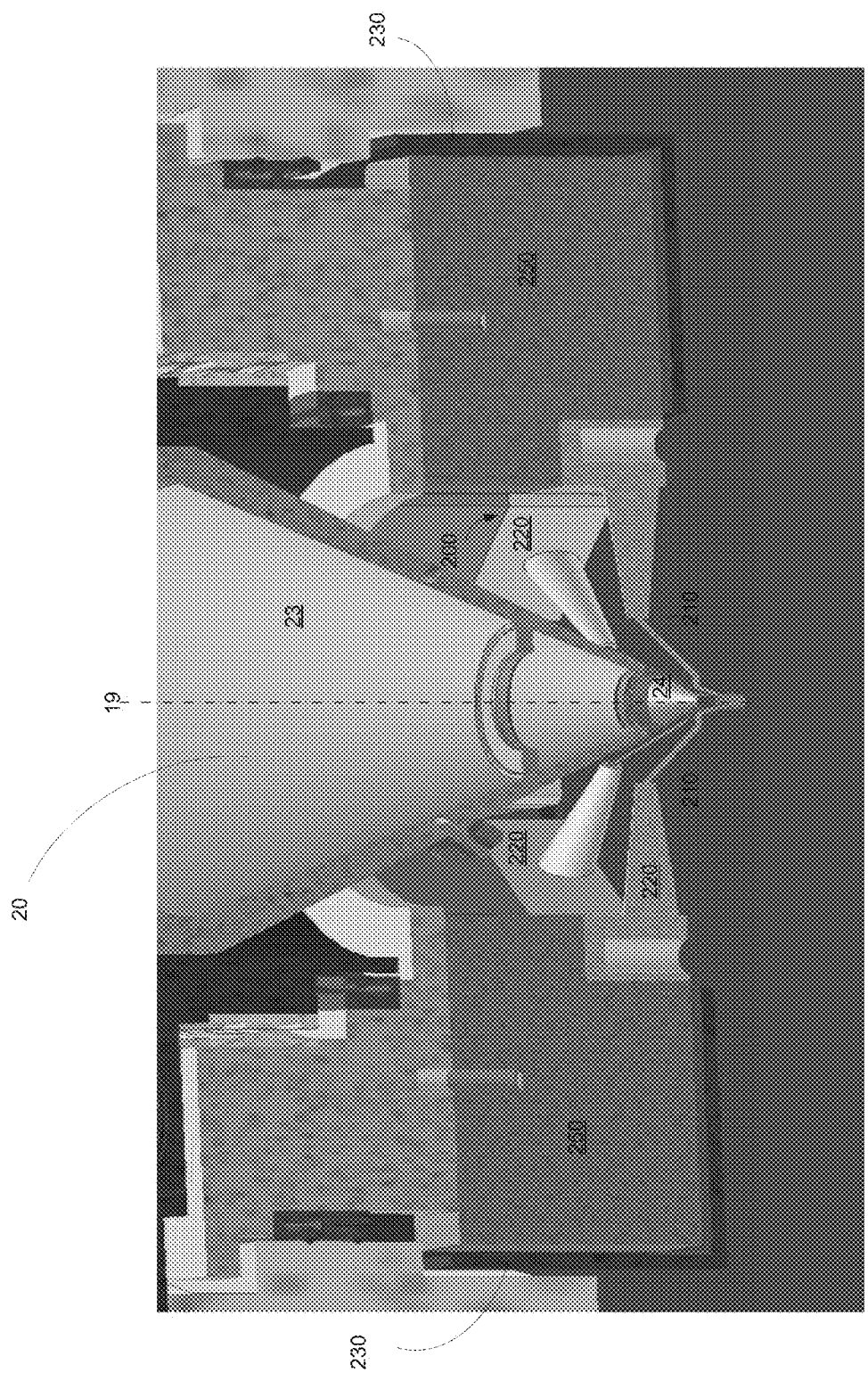
FIG. 4 illustrates a portion of a column, a shield and multiple nano-probe modules according to an embodiment of the invention.
Figure 5:
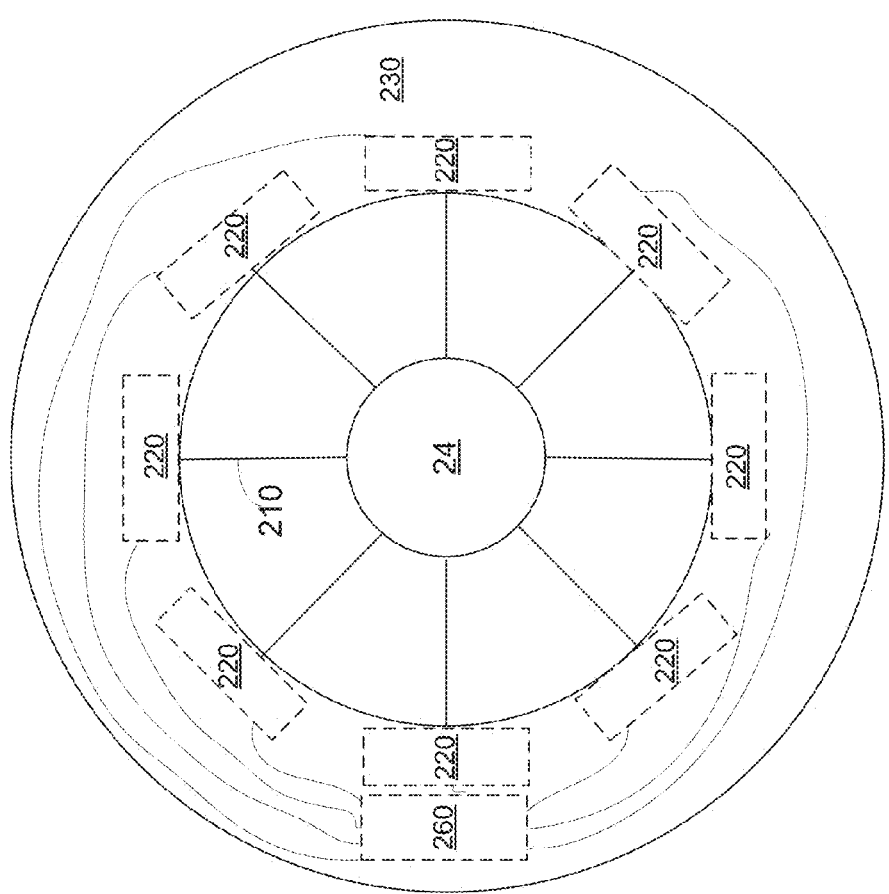
FIG. 5 illustrates a portion of a column, a shield, electrical tester and multiple nano-probe modules according to an embodiment of the invention.

FIGS. 4 and 5 provide an example of shield 230 that has an annular shape. The nano-probes 210 may enter the aperture defined by the shield 230. Also shown in FIG. 4 is a nano-probe module interface 250 attached to column 20. Interface 250 includes connectors (not shown in FIG. 4) that connect the nano-probe modules 200 to column 20. The nano-probe module connector interface can include any appropriate connectors that enable the nano-probe modules to be detachably connected to the column 20.

Nano-probe motors 220 and nano-probe module interface 250 are positioned above the shield 230 so that particles generated by the nano-probe motors 210 are caught by the shield 230.

The nano-probe modules are connected in a detachable manner to nano-probe module interface 250. In some embodiments, each nano-probe motor 220 includes a cavity 240 to which nano-probe module holder 70 can connect to remove nano-probe modules 200 from nano-probe module interface 250 as described below with respect to FIGS. 7-10) and then replace the removed nano-probe modules 200 with a new set of nano-probe modules 200 without opening vacuum chamber 40.

FIGS. 4 and 5 illustrate the lower edge 24 of the column 20 and FIG. 4 also illustrates an intermediate part 23 of column 20 as well as the electron beam 19.

FIG. 5, which is a cross-sectional view as looked at from below the column, illustrates that the nano-probes 210 are coupled to electrical tester 260 that may feed the nano-probes with the desired input signals and may receive electrical signals sensed by the nano-probes. It is noted that the electrical tester 260 may be positioned outside system 13 or at other places within system 13. A non-limiting example of an electrical tester is Keithley 4200. The electrical tester 260 may be configured to inject pre-defined current-voltage profiles through the nano-probes and measure the outcome electrical values.

FIG. 5 illustrates that the nano-probes 210 and column 20 are concentric and that the nano-probes of the nano-probe modules are located within a field of view of the column 20 when positioned in an object-contacting positions in which the nano-probes contact the object. Nano-probe module interface 250 is not visible in FIG. 5 as it is behind shield 230.

Figure 6:
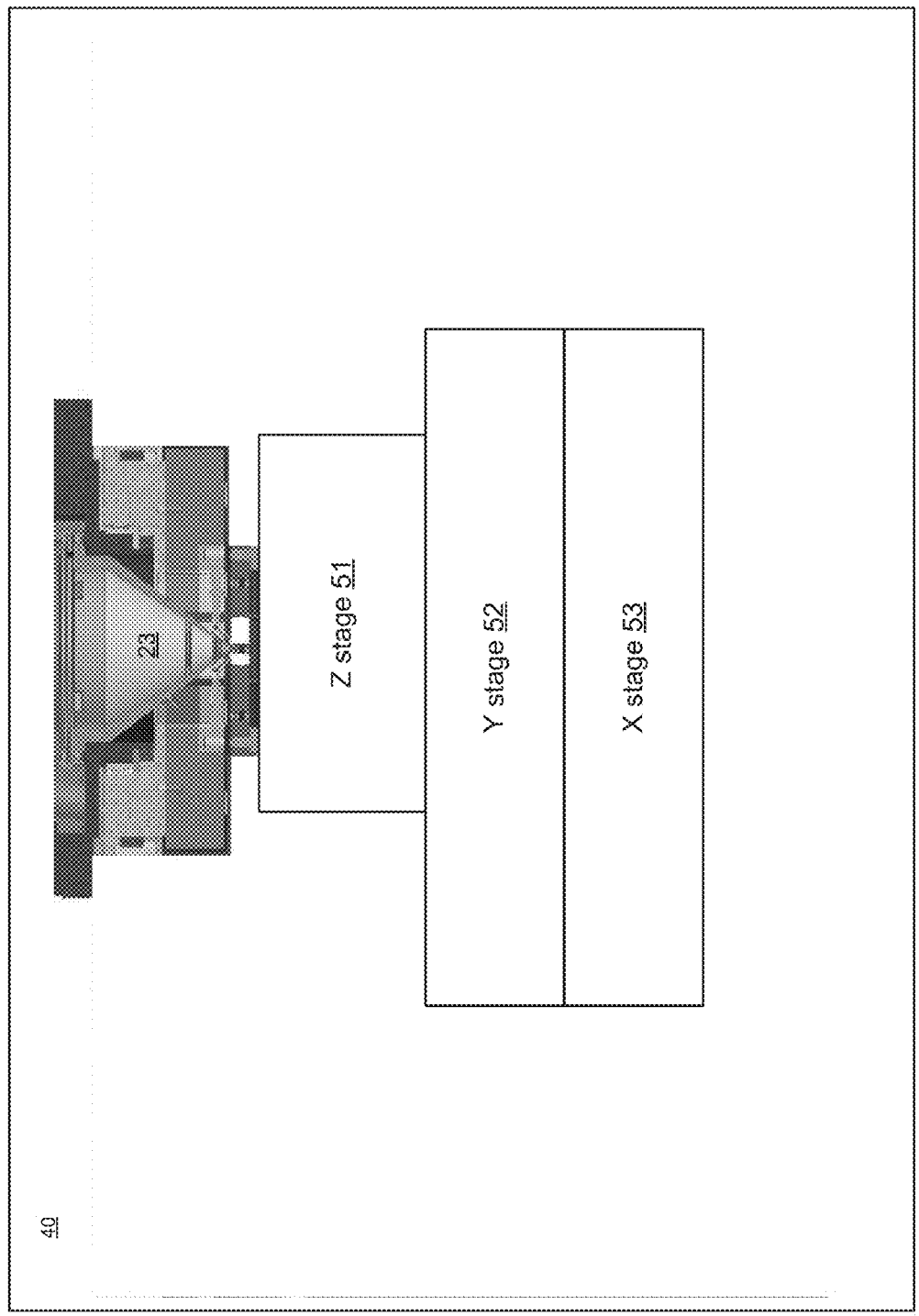
FIG. 6 illustrates a portion of a system according to an embodiment of the invention.

FIG. 6 illustrated a mechanical stage 50 that includes a Z stage 51, a Y stage 52 and an X stage 53.

Figure 7:
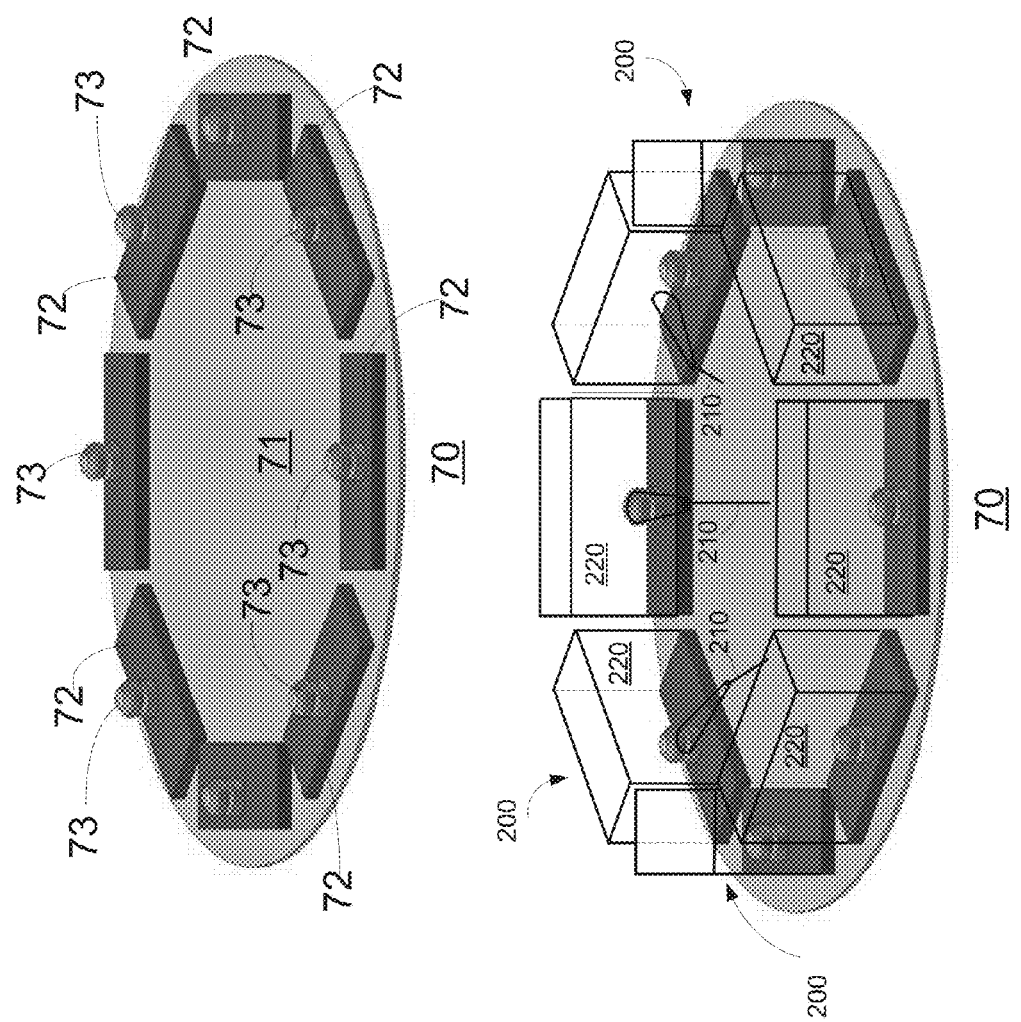
FIG. 7 illustrates a nano-probe modules holder and nano-probe modules according to an embodiment of the invention.

FIG. 7 illustrates an empty nano probe modules holder 70 and a nano probe modules holder 70 that supports nano-probe modules including nano-probe motors 220 and nano-probes 210. Nano probe modules holder 70 includes a lower surface 71 and multiple holders—each holder has a base 72 and a nano-probe module connector 73.

According to an embodiment of the invention the nano-probe modules are mechanically connected to the column in a detachable manner and the replacement of a nano-probe module includes detaching the nano-probe module from the column.

Figure 8:
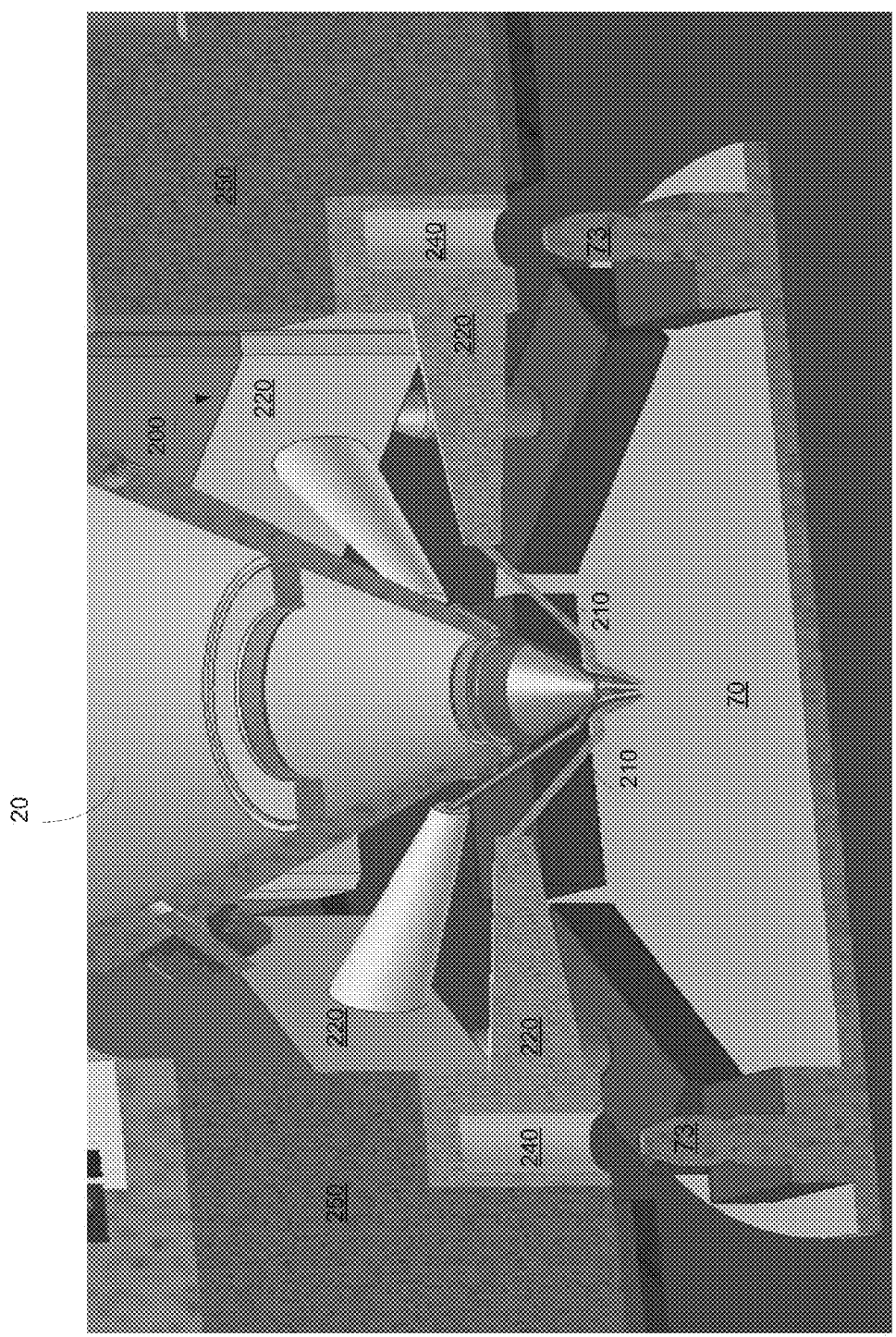
FIG. 8 illustrates a nano-probe module holder and a portion of a column, a shield, and multiple nano-probe modules during a first phase of a nano-probe modules removal process according to an embodiment of the invention.
Figure 9:
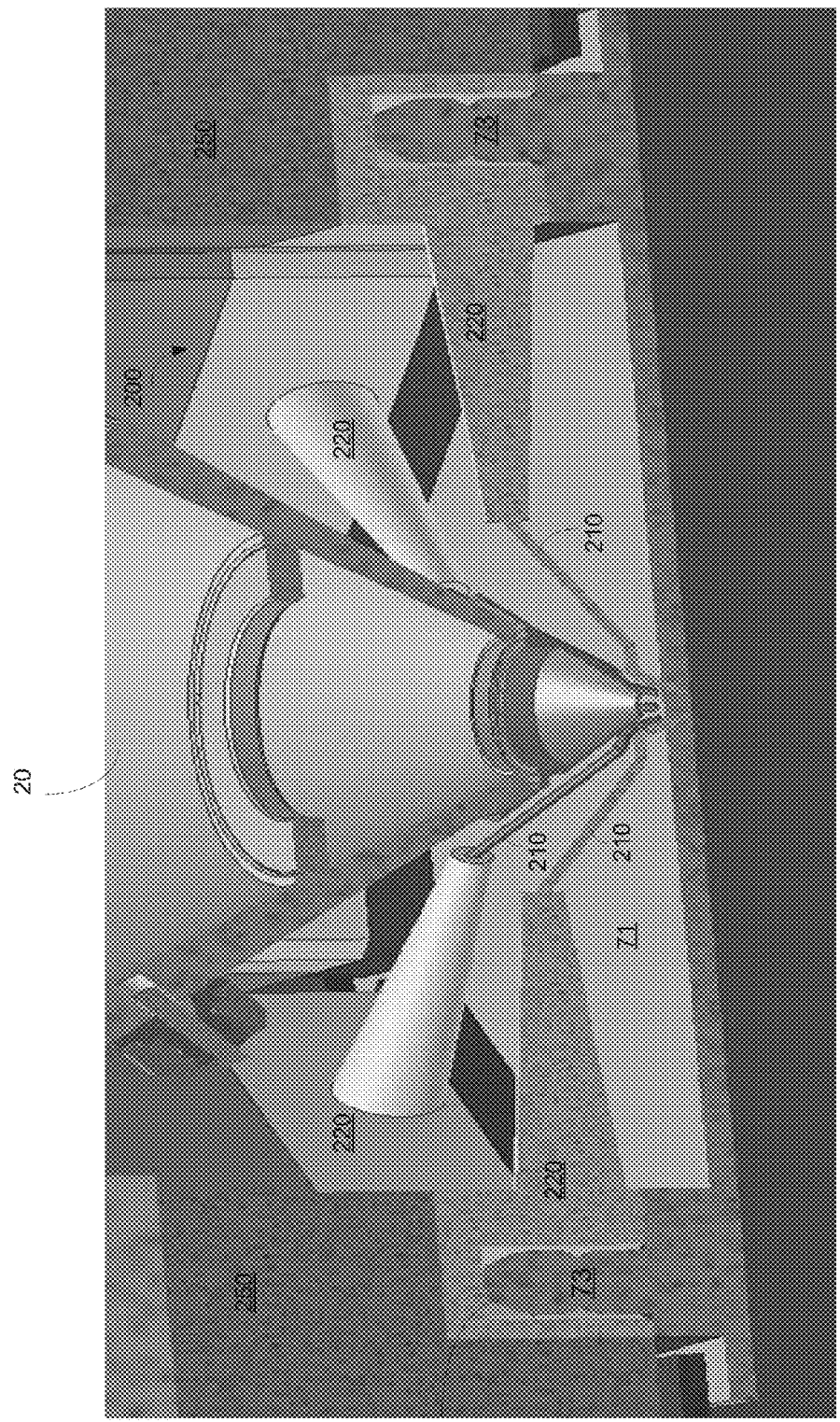
FIG. 9 illustrates a nano-probe module holder and a portion of a column, a shield, and multiple nano-probe modules during a second phase of a nano-probe modules removal process according to an embodiment of the invention.
Figure 10:
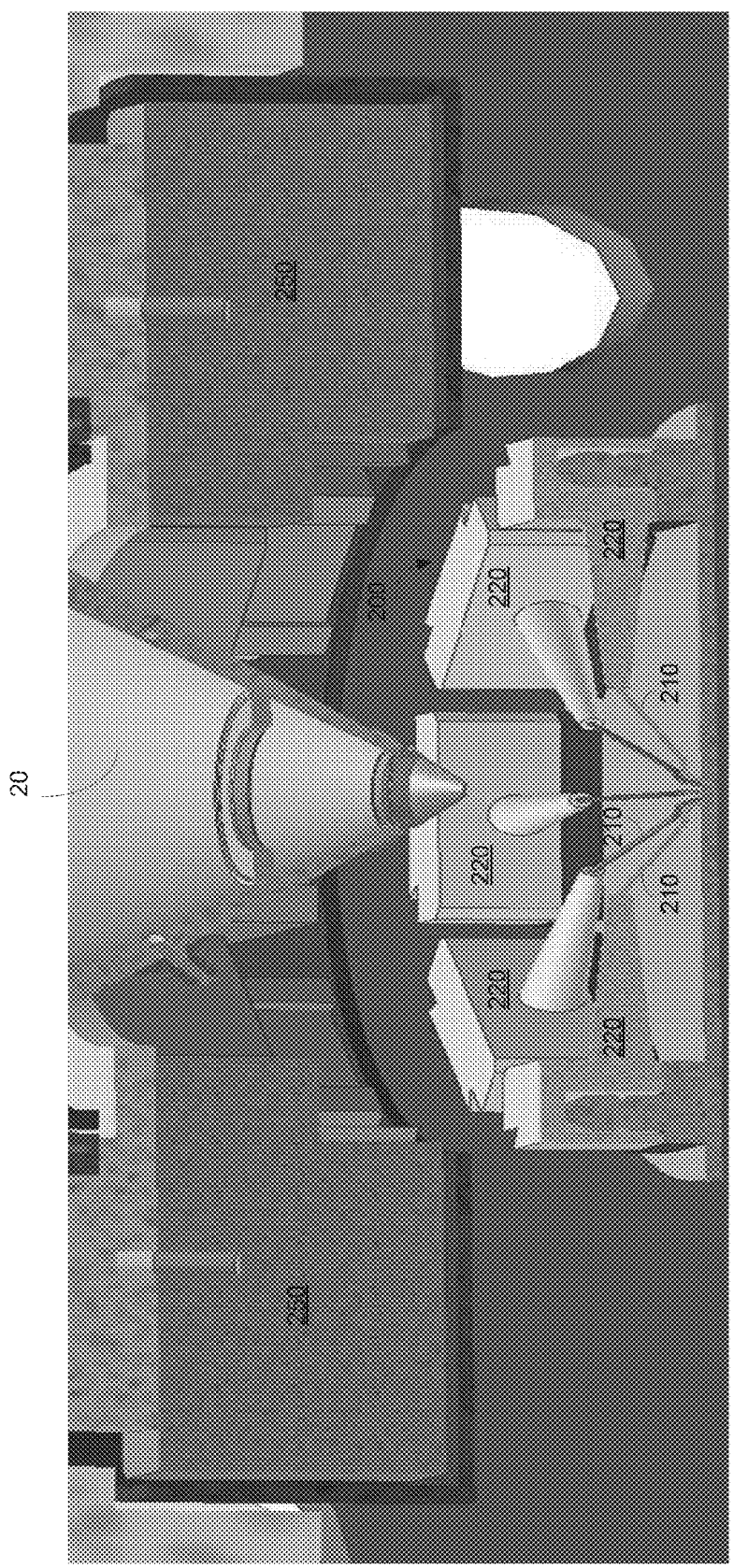
FIG. 10 illustrates a nano-probe module holder and a portion of a column, a shield, and multiple nano-probe modules during a third phase of a nano-probe modules removal process according to an embodiment of the invention.

FIGS. 8-10 illustrate three phases of a nano-probe modules removal process during which nano-probe modules that were detachably connected to column 20 are lowered towards an empty nano probe modules holder 70 (FIG. 8), are connected to nano probe holder 70 (FIG. 9), and then detached from column 20 while remaining connected to the nano probe modules holder 70 (FIG. 10). In FIGS. 8-10 the nano probe modules holder 70 is illustrated as including nano-probe module connectors 73 that enter cavities 240 formed within the nano-probe motors 220.

The nano-probe module connectors 73 may be shaped and sized to hold the nano-probe modules 200 and enable the detachment of the nano-probe modules 200 from column 20 once the column is elevated from the nano probe modules holder 70.

Figure 11:
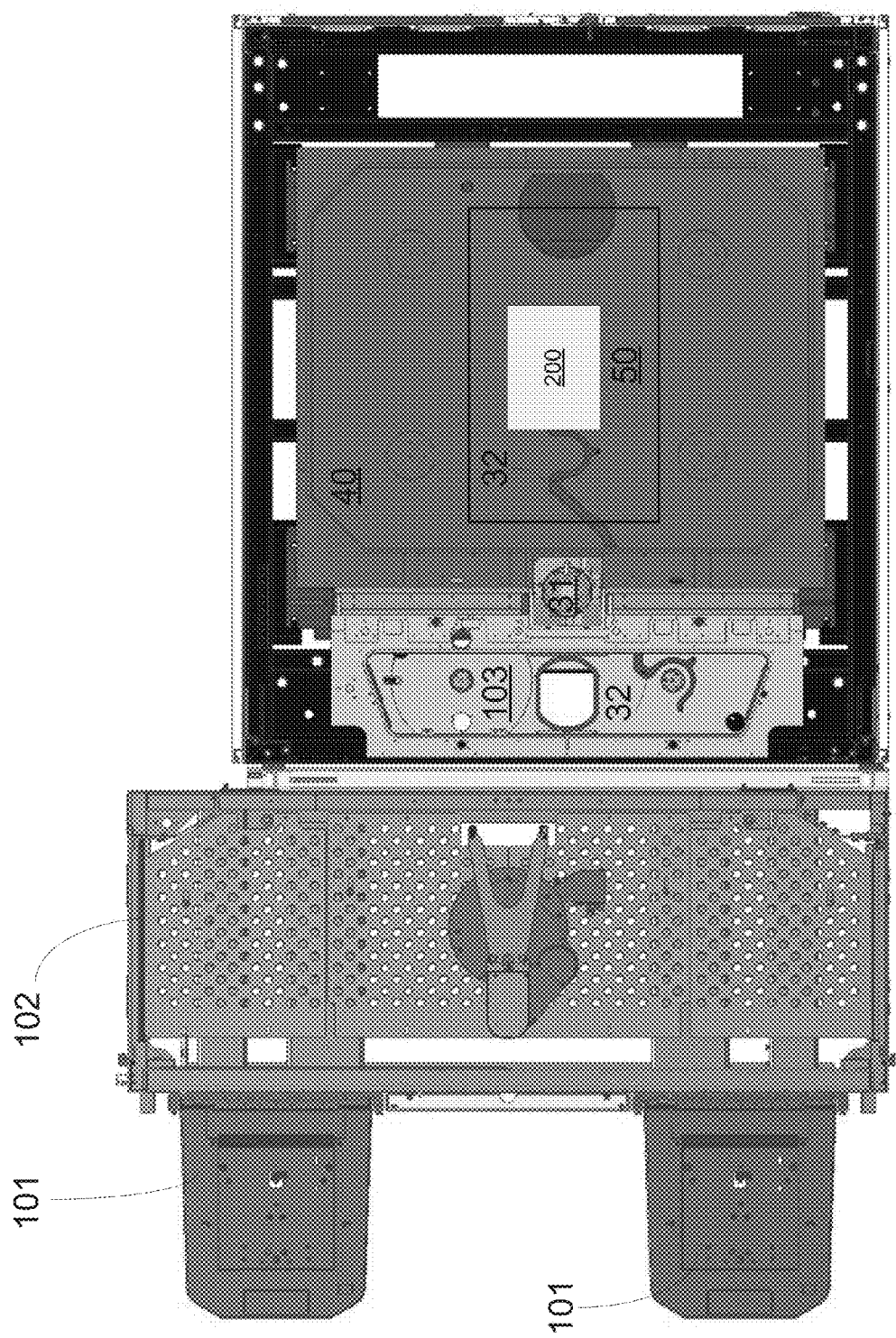
FIG. 11 illustrates a system according to an embodiment of the invention.

FIG. 11 illustrates system 14 according to an embodiment of the invention.

System 14 is illustrated as including a scanning electron microscope and nano-probe modules 200. The scanning electron microscope has a column (not shown), vacuum chamber 40, cassette holders 101, Front Interface (FI) 102, load lock 103, mechanical stage 50, an arm 32 and a controller 31 of an ITU.

Figure 12:
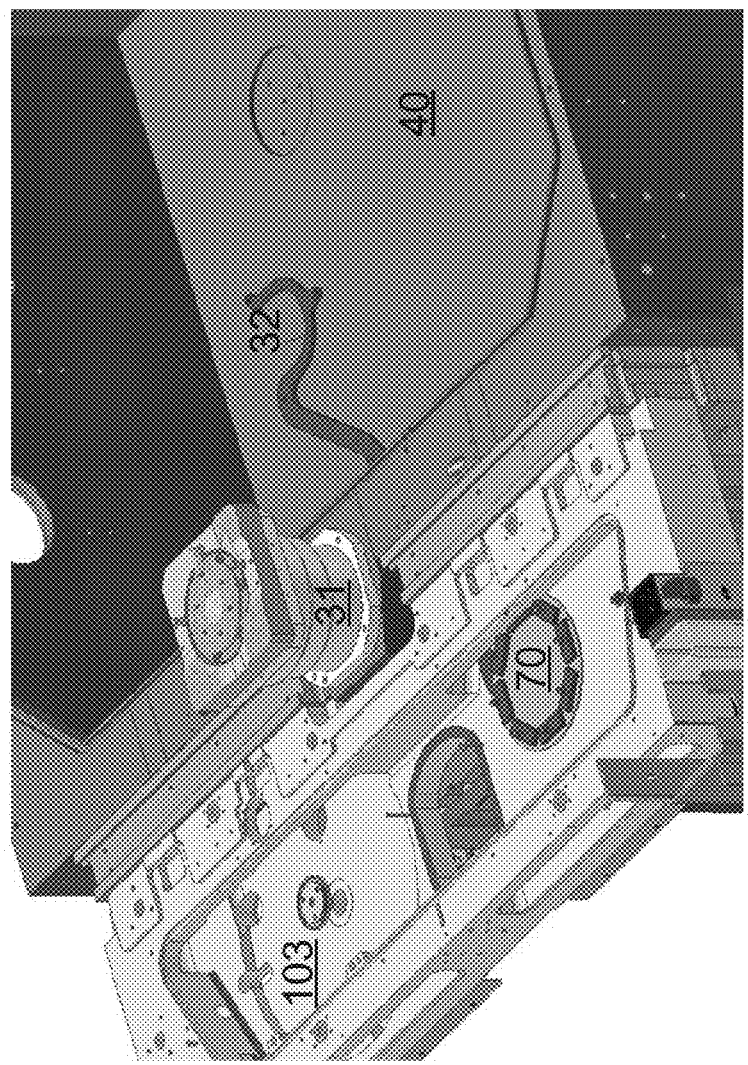
FIG. 12 illustrates a portion of a system during a first phase of an insertion of a nano-probe modules holder into a vacuum chamber of the system according to an embodiment of the invention.

FIG. 12 illustrates the first position of the arm 32. During a loading process the arm 32 contacts nano probe modules holder 70 that is located outside vacuum chamber 40 and in a load lock unit 103.

Figure 13:
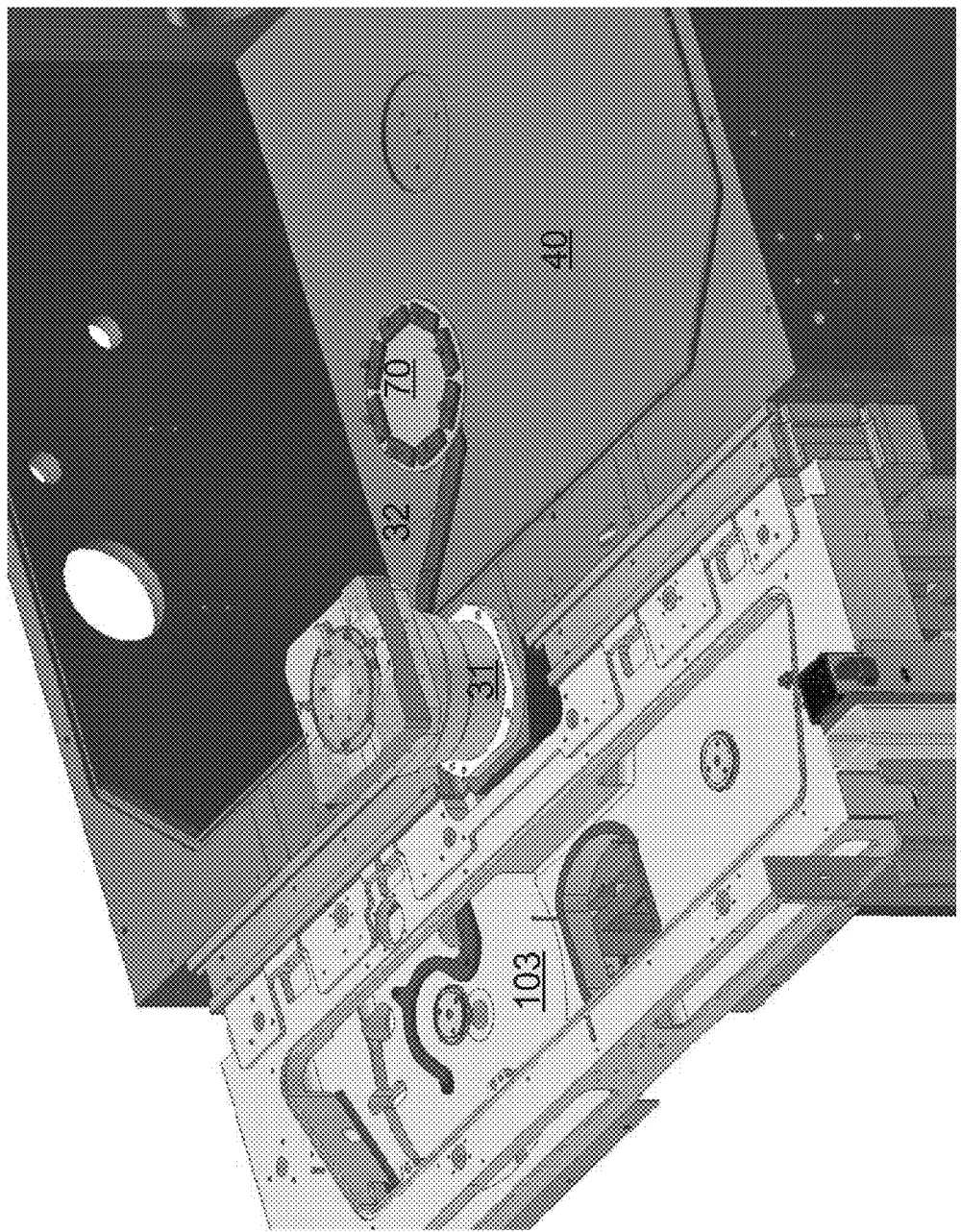
FIG. 13 illustrates a portion of a system during a second phase of an insertion of a nano-probe modules holder into a vacuum chamber of the system according to an embodiment of the invention.

FIG. 13 illustrates the second position of the arm 32. During a loading process the arm 32 contacts nano probe modules holder 70 that is located within vacuum chamber 40.

Any one of systems 11-14 may be configured to utilize the navigation capabilities of the scanning electron microscope to navigate to multiple areas that include elements to be electrically tested.

According to various embodiments of the invention any one of systems 11-14 may use the scanning electron microscope imaging capability and is also capable of measuring electrical parameters of integrated circuit (IC) elements on semiconductor wafers, at different process steps during the manufacturing flow (for example Contact CMP step) of the ICs, or after the completion of the manufacturing flow.

Any one of systems 11-14 may be configured to perform at least one of the following:

1. Perform electrical tests within a die or at scribe lines between dies.
2. Perform electrical tests on test structures or on real IC elements.
3. Perform electrical tests on any IC elements. For example transistor, capacitor, diode, resistor, memory cell, or combination of those
4. Measure any known electrical parameter, for example voltage threshold (Vt).
5. Use the charged particle beam 19 as additional probe /current source (IBIC Electron Beam Induce Current) on a wafer.
6. Use the charged particle beam 19 as additional probe (voltage contrast imaging)
7. Test functionality of sub-device element, for example scan-chains on logic devices.

Any one of systems 11-14 is configured to automatically handle a semiconductor wafer (i.e. loading, unloading, accurate alignment, accurate navigation and imaging of pre-defined locations).

A non-limiting example of various parameters of the scanning electron microscope of any one of systems 11-14 is provided below:

1. Resolution: 1-10 nm, typically 2 nm.
2. Current range: 1 pA to 10 nA, typically 250 pA.
3. Landing energy range: 0.1 KV to 30 KV, typically 0.5 KV.
4. TPT—up to 20,000 locations per hour, typical TPT will depend on the time of electrical measurement, for example 500 measurements/hour of Vt.

A non-limiting example of various parameters of the nano-probe modules of any one of systems 11-14 is provided below:

1. Number of probes is 2-16, typically 8.
2. Tip radius is 5-50 nm, typically 10 nm.

System 14 may uses the wafer cassette 101 as a holder for a probe replacement kit.

Any one of systems 11-14 may enable a manual, a semi-automated and a fully automated operation modes of electrical testing.

An automated measurement mode may support one or any combination of the following capabilities:

1. Get a list of multiple locations within the wafer, for example in the form of KLARF.
2. Get computer aided design (CAD) information on measurement locations, for example in the form of GDS file.
3. Use the KLARF and GDS for aligning the probes with the structure to be measured to proximity better than 500 nm in X and Y axes, typically 50 nm.
4. Use CAD information, a scanning electron microscope image, and image processing algorithms to bring the probes into contact with the required structures on the wafer with proximity better than 10 nm, typically 1 nm.

A manual measurement mode may enable complete manipulation of each probe through the user interface.

A Semi-automated mode will enable manual selection of measurement locations by one of the following:

1. Entering X, Y coordinates.
2. Pointing on specific locations in the SEM image.
3. Pointing on specific locations on the design layout (GDS).

A recipe for automated measurements will include the following elements:

1. SEM imaging parameters.
2. Wafer alignment.
3. CAD information.
4. CAD registration parameters.
5. Electrical parameters to be measured.
6. Measurement locations within a die.
7. Dies to be measured within the wafer.

Figure 14:
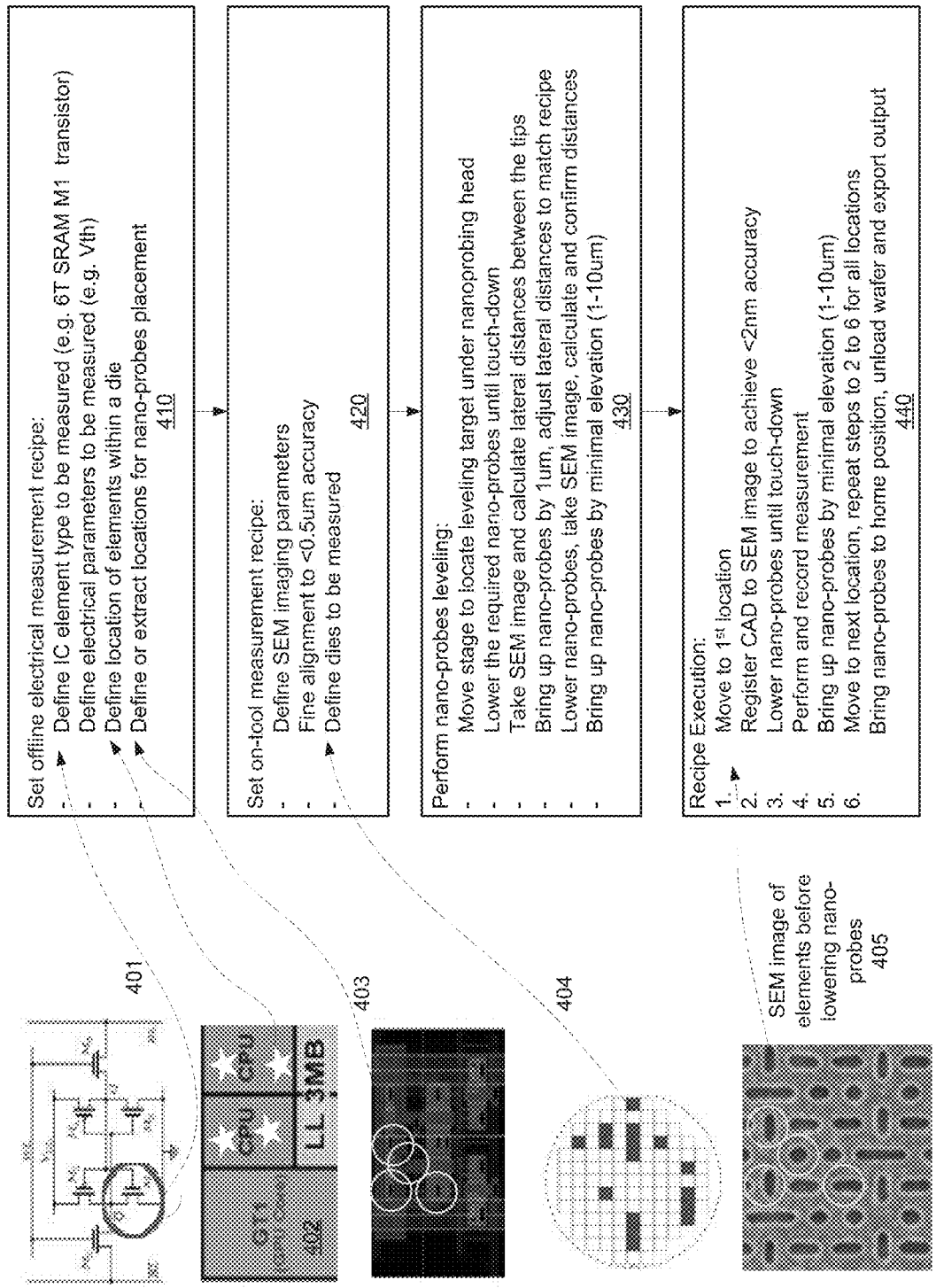
FIG. 14 illustrates a method according to an embodiment of the invention.

FIG. 14 illustrates a method 400 according to an embodiment of the invention.

Method 400 includes a sequence of stages 410, 420, 430 and 440.

Stage 410 may include setting offline electrical measurement recipe such as:

1. Define IC element type to be measured (e.g. 6T SRAM M1 transistor 401).
2. Define electrical parameters to be measured (e.g. Vth).
3. Define location of elements within a die (see image 402).
4. Define or extract locations for nano-probes placement (see circles 403).

Stage 420 may include setting on-tool measurement recipe:

1. Define SEM imaging parameters.
2. Fine alignment to <0.5 um accuracy.
3. Define dies to be measured (see wafer map 404 and selected dies).

Stage 430 may include performing nano-probes leveling (calibration):

1. Move stage to locate leveling target under nano-probing head.
2. Lower the required nano-probes until touch-down.
3. Take SEM image and calculate lateral distances between the tips.
4. Bring up nano-probes by 1um, adjust lateral distances to match recipe.
5. Lower nano-probes, take SEM image, calculate and confirm distances.
6. Bring up nano-probes by minimal elevation (1-10 um).

Stage 440 may include Recipe Execution:

1. Move to 1$^{st}$ location.
2. Register CAD to SEM image to achieve <2 nm accuracy.
3. Lower nano-probes until touch-down.
4. Perform and record measurement.
5. Bring up nano-probes by minimal elevation (1-10 um).
6. Move to next location, repeat steps to 2 to 6 for all locations.
7. Bring nano-probes to home position, unload wafer and export output.

In the foregoing specification, the invention has been described with reference to specific examples of embodiments of the invention. It will, however, be evident that various modifications and changes may be made therein without departing from the broader spirit and scope of the invention as set forth in the appended claims.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or module elements or impose an alternate decomposition of functionality upon various logic blocks or module elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense. Additionally, any combinations of any of the components of any of the figures can be provided; any combination of any of the systems mentioned above can be provided; and any combination of any of the methods mentioned above can be provided.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an" The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A system for electrically testing an object, the system comprising:
   a vacuum chamber;
   an object support configured to support and move an object within the vacuum chamber during an electrical testing operation;
   a scanning electron microscope that comprises a column configured to illuminate areas of the object with a beam of charged particles while the object is positioned on the object support during an electrical testing operation, the column including one or more stabilizing elements;
   a plurality of nano-probe modules mechanically connected to and positioned in a concentric arrangement with the column within the chamber, the plurality of nano-probe modules comprising a plurality of nano-probes that are configured to electrically contact elements of the object during the electrical testing operation and a plurality of nano-probe motors configured to move the nano-probes in relation to the column; and
   a shield positioned between the plurality of nano-probe motors and the object support and having an aperture aligned with the column through which the nano-probes may contact the object, wherein the shield is configured to reduce contamination as a result of operation of the nano-probe motors.

2. The system according to claim 1 wherein the nano-probes of the nano-probe modules are located within a field of view of the column when positioned in an object-contacting positions.

3. The system according to claim 1 wherein the shield is an electro-static shield that is configured to attract contaminants generated by the nano-probe motors.

4. The system according to claim 1 further comprising a nano-probes calibration target; wherein the system is configured to utilize the nano-probes calibration target for determining reference nano-probes position parameters that once used cause the nano-probes to be positioned at desired positions.

5. The system according to claim 4 that is configured to use the reference nano-probes position parameters when electrically testing at least one element of the object.

6. The system according to claim 4 that is configured to use the reference nano-probes position parameters to concurrently contact multiple test points of an element of the object.

7. The system according to claim 4 that is configured to use the reference nano-probes position parameters to position a plurality of nano-probes at a same height.

8. The system according to claim 1 wherein the nano-probe modules are mechanically connected to the column in a detachable manner; and wherein the system further comprises a nano-probe module replacement module that is configured to detach the nano-probe modules from the column and replace the nano-probe modules by a new set of nano-probe modules.

9. The system according to claim 8 wherein the nano-probe module replacement module is configured to detach the nano-probe modules from the column and replace the nano-probe modules by the new set of nano-probe modules without opening the vacuum chamber.

10. The system according to claim 8 comprising an internal transfer unit that is configured to receive, outside the vacuum chamber, the new set of nano-probe module and inset the new set of nano-probe modules into the vacuum chamber.

11. The system according to claim 1 wherein the scanning electron microscope is configured to navigate the column towards the areas that comprises the elements using computer aided design information of the object.

12. The system according to claim 1 wherein the scanning electron microscope is configured to navigate the column towards the areas that comprise the elements using coordinates of the elements.

13. A system for electrically testing an object, the system comprising:
    a vacuum chamber;
    a object support configured to support a object within the vacuum chamber and move the object in a plurality of dimensions;
    a scanning electron microscope that comprises a fixed and stable column configured to illuminate areas of the object with a beam of charged particles during an imaging process;
    a plurality of detachable nano-probe modules arranged concentric with the column, wherein each nano-probe module is detachably connected to the column and includes a nano-probe motor and a nano-probe configured to electrically contact elements of the object during electrical tests of the object; and
    a shield positioned between the nano-probe motors and the object support and having an aperture aligned with the column through which the nano-probes may contact the object, wherein the shield is configured to reduce contamination as a result of operation of the nano-probe motors.

14. The system according to claim 13 wherein the shield is an electro-static shield that is configured to attract contaminants generated by the nano-probe motors.

15. The system according to claim 1 further comprising a nano-probe module replacement module configured to detach the nano-probe modules from the column and replace the nano-probe modules by a new set of nano-probe modules.

16. The system according to claim 8 wherein the nano-probe module replacement module is configured to detach the plurality of detachable nano-probe modules from the column and replace the plurality of detachable nano-probe modules by a new set of nano-probe modules without opening the vacuum chamber.

* * * * *

UNITED STATES PATENT AND TRADEMARK OFFICE
CERTIFICATE OF CORRECTION

PATENT NO. : 9,958,501 B1  
APPLICATION NO. : 15/060245  
DATED : May 1, 2018  
INVENTOR(S) : Amir Wachs, Alon Litman and Efim Vinnitsky Page 1 of 1

It is certified that error appears in the above-identified patent and that said Letters Patent is hereby corrected as shown below:

On the Title Page

The Assignee APPLIEED MATERIALS ISRAEL LTD. should be corrected to read:
-- APPLIED MATERIALS ISRAEL LTD. --

Signed and Sealed this  
Thirty-first Day of July, 2018

Andrei Iancu  
*Director of the United States Patent and Trademark Office*